United States Patent [19]

Bird

[11] 4,399,414
[45] Aug. 16, 1983

[54] LOW-NOISE PULSE CONDITIONER

[75] Inventor: David A. Bird, Oak Ridge, Tenn.

[73] Assignee: The United States of America as represented by the U.S. Department of Energy, Washington, D.C.

[21] Appl. No.: 274,120

[22] Filed: Jun. 16, 1981

[51] Int. Cl.³ .................. H03K 5/153; G01R 19/04; G01R 19/175

[52] U.S. Cl. .................................. 328/151; 307/351; 307/354; 307/358; 328/28

[58] Field of Search ...................... 328/5, 13, 28, 150, 328/151, 164; 307/260, 261, 268, 350, 351, 354, 358, 359

[56] References Cited

U.S. PATENT DOCUMENTS 3,797,894 3/1974 Carp ..................................... 307/351
4,090,144 5/1978 Jenik et al. .......................... 307/354
4,169,232 9/1979 Henrich ............................. 307/354

Primary Examiner—John Zazworsky
Attorney, Agent, or Firm—David E. Breeden; Stephen D. Hamel; Richard G. Besha

[57] ABSTRACT

A low-noise pulse conditioner is provided for driving electronic digital processing circuitry directly from differentially induced input pulses. The circuit uses a unique differential-to-peak detector circuit to generate a dynamic reference signal proportional to the input peak voltage. The input pulses are compared with the reference signal in an input network which operates in full differential mode with only a passive input filter. This reduces the introduction of circuit-induced noise, or jitter, generated in ground referenced input elements normally used in pulse conditioning circuits, especially speed transducer processing circuits.

4 Claims, 6 Drawing Figures

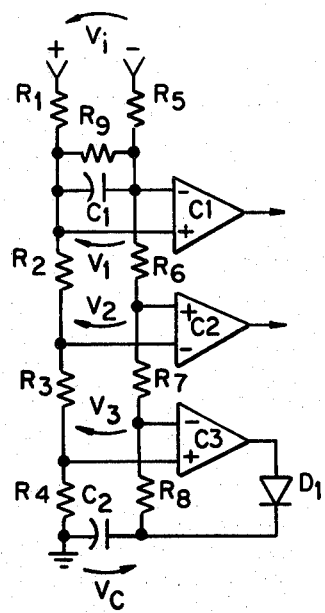
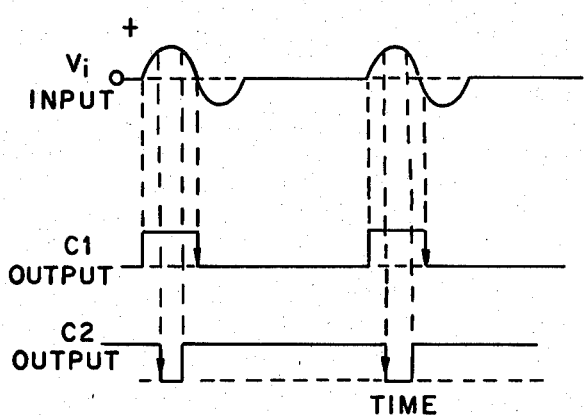

LOW-NOISE PULSE CONDITIONER

This invention is a result of a contract with the United States Department of Energy.

BACKGROUND OF THE INVENTION

This invention relates generally to pulse conditioning circuits and, more particularly, to pulse conditioning circuits used to convert transducer analog pulses for driving electronic digital processing circuitry.

In various electronic digital control or monitoring applications for a rotating device or system variable, a sensing element is used which produces a repeating analog signal whose amplitude and/or repetition rate varies with changes in the speed of the device or the system variable. For example, a variable reluctance magnetic pickup coil, known as a Fidler coil, is used to sense rotor speed in a gas centrifuge for separation of isotopic gaseous mixtures. The coil is located in the field of a magnetic bearing for the rotor. A differential signal is induced in the coil each time a field perturbating notch formed in the bearing magnetic armature carried by the rotor passes the coil. The signal obtained is not ideal for driving electronic digital processing circuitry since the amplitude and pulse width undergo changes of orders of magnitude over the normal speed range of an operating centrifuge. The signal slope is very low and noise levels at run speed are greater than signal levels at low speed.

Since this type of analog signal cannot be used to drive a digital control or monitoring system directly, it must be conditioned to provide a digital timing signal. This timing signal is usually provided by a one-shot in which the leading edge of the digital pulse output coincides with the negative-going zero crossing of the analog input pulse.

Several circuits have been developed to condition the Fidler signal to obtain the digital timing signal. Generally, these circuits employ an adaptive sensing technique in which a DC level is developed proportional to the input peak voltage and used to dynamically vary the threshold at which the one-shot is armed by the input signal. This allows the circuit to reject noise components at the input in situations where the high speed noise is greater than the low speed signal amplitude.

These circuits employ a single pole low-pass input filter to eliminate high-frequency noise components outside the effective bandwidth of the signal spectrum. These circuits use an input differential amplifier to change the differential input signal to a ground referenced signal and reject common mode noise. The shielded twisted-pair cable from the coil is terminated in a 100 ohm input resistance to reduce differential induced noise.

In amplifying and conditioning a sensor signal, such as the signal from the Fidler coil, noise may be introduced into the signal producing a pulse-to-pulse variation in the relationship between the digital timing signal pulse and the zero crossing of the magnetic pick-up signal. This pulse-to-pulse variation, called jitter, places fundamental limits on the accuracy and response time of the speed and acceleration processing circuitry. In order to maximize the accuracy and/or minimize the response time of the processing circuitry, the jitter must be minimized. Thus, there is a need for improvements in pulse conditioning circuits to provide more accurate timing pulse generation for use in digital processing circuitry.

SUMMARY OF THE INVENTION

In view of the above need, it is an object of this invention to provide a low noise pulse conditioner with improved jitter performance.

Another object of this invention is to provide an improved low noise pulse conditioner as in the above object for driving a digital processing circuit directly from a full differential input analog pulse signal.

Further, it is an object of this invention to provide a differential-to-peak detector which allows direct input circuit differential biasing for providing a dynamic triggering threshold proportional to the peak input voltage in a low noise pulse conditioner as set forth in the above objects.

Other objects and many of the attendant advantages of the present invention will be obvious from the following detailed description taken in conjunction with the drawings.

In summary, the differential-to-peak detector includes a comparator amplifier connected to receive a differential input signal at its inputs. The output voltage is impressed across a storage capacitor through a rectifying means. The capacitor is connected to the amplifier inputs through appropriate resistors in differential opposition to the input signal so that the input voltage must exceed the capacitor voltage to activate the output. Thus, the voltage across the capacitor is maintained at a voltage proportional to the peak voltage of the input signal.

A differential input pulse conditioner for driving a digital processing circuit may be provided in which the triggering threshold may be varied in proportion to the input pulse peak voltage by connecting the differential-to-peak detector in parallel with the pulse conditioner input.

The detector may be used with a single comparator for developing a digital timing pulse from a sensor analog pulse.

Further, the detector may be used to vary the bias of an arming comparator which enables a digital timing device to be triggered by an AC input signal zero-crossing trigger-point detector. The trigger-point detector may be an additional comparator connected in parallel with the arming comparator to receive the differential input signal.

BRIEF DESCRIPTION OF THE DRAWINGS

The accompanying drawings, which are incorporated in and form a part of the specification, illustrate various embodiments of the present invention and together with the description, serve to explain the principles of the invention. In the drawings:

FIG. 1 is a schematic diagram of a low noise pulse conditioner for use with a gas centrifuge rotor Fidler coil type speed sensor;

FIG. 2 is a graphic illustration of the timing relationship of the input and output pulses of the circuit of FIG. 1;

DETAILED DESCRIPTION

Referring now to FIG. 1, a low noise pulse conditioner made in accordance with the present invention will be described. Although the invention will be illustrated for use in conditioning a Fidler coil signal used for sensing the speed of a gas centrifuge, it will be obvious that the circuit is applicable to other sensing devices or other pulse conditioning applications.

In the Fidler coil conditioning circuit of FIG. 1, the comparator C1 is a zero crossing trigger point detector which produces a falling edge trigger pulse, as shown in FIG. 2, coincident with the negative-going zero crossing of the AC input signal pulse. The comparator C2 is an arming signal generator which is connected to provide a negative-going "arming" pulse when the input signal reaches a predetermined level relative to the signal peak voltage. The arming signal may be used to signal a processing circuit that the next zero crossing of the input pulse is a proper input signal to be processed and not a noise activated trigger.

Figure 4:
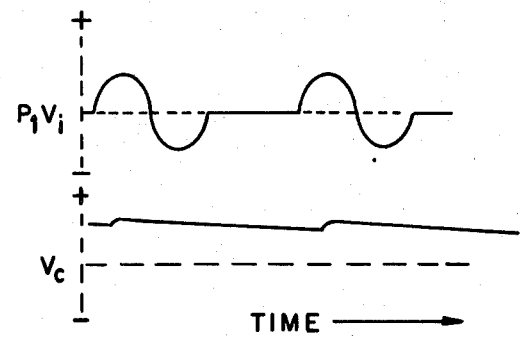
FIG. 4 is a graphic illustration of the input and output waveforms of the detector of FIG. 3.

The comparator C3 and associated circuitry comprise a peak detector which develops a voltage ($V_c$) across $C_2$ which is directly proportional to the peak voltage of the input signal, as shown in FIG. 4. The output of the comparator C3 is connected through a diode D1 to one side of the capacitor $C_2$ and through a resistor $R_8$ to the inverting input (−) of the comparator C3. The non-inverting input of C3 is connected through a resistor $R_4$ to the grounded side of capacitor $C_2$.

The differential input signal, for example, the output from a gas centrifuge Fidler coil, is applied through resistors $R_5$ and $R_1$ to the inverting and non-inverting inputs, respectively, of comparator C1. A capacitor $C_1$ and a resistor $R_9$ connected in parallel across the inputs to C1 together with resistors $R_1$ and $R_5$ form a single low-pass RC filter for attentuating noise above the bandwith of the input signal spectrum.

The inverting input of C1 is connected to the non-inverting input of C2 through a resistor $R_6$ and further to the inverting input of C3 through an additional resistor $R_7$ in series with $R_6$. Similarly, the non-inverting input of C1 is connected to the inverting input of C2 through resistor $R_2$ and further to the non-inverting input of C3 through resistor $R_3$.

In operation, the input voltage is applied differentially with the polarities as shown in FIG. 1. The resistor network is balanced symmetrically so that $R_1=R_5$, $R_2=R_6$, $R_3=R_7$, and $R_4=R_8$. The capacitor $C_2$ voltage ($V_c$) is proportional to the peak voltage of the input signal $V_i$. This DC voltage biases the entire network so that the voltage $V_i$ triggers C1, C2, and C3 in order as the amplitude of the positive half of the signal increases.

The resistance composed of the sum of $R_2$, $R_3$, $R_4$, $R_6$, $R_7$, and $R_8$ is made large compared to $R_9$ so that $V_c$ is attenuated to nearly zero at the input of C1. Thus, C1 triggers essentially at zero voltage. Since the bias voltage at the input of C2 is proportional to $V_c$ and, therefore, to the peak of the input voltage $V_{ip}$, C2 will trigger as the input voltage rises to greater than some voltage proportional to the peak voltage already established on $C_2$. Thus, the output from C2 will not trigger on any voltage less than the reference maximum established by the peak voltage of the signal. This arming signal is used to signal the processing circuitry that the zero crossing related trigger pulse transition will be the next transition out of C1.

Figure 3:
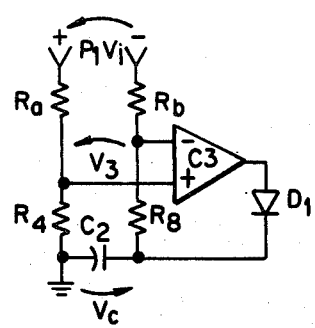
FIG. 3 is a schematic diagram of the differential-to-peak detector circuit of FIG. 1 modified to operate independently.

Referring now to FIG. 3, the differential-to-peak detector operates as follows: where $R_a = R_2 + R_3$, $R_b = R_6 + R_7$, and the voltage at the input to C1 is the attenuated input voltage $$V_1 \sim V_i \frac{R_9}{2R_1 + R_9} = \frac{V_i}{1 + 2\frac{R_1}{R_9}} \text{ so that } P_1 = \frac{1}{1 + 2\frac{R_1}{R_9}},$$

where $P_1$ is a constant of proportionality relating $V_i$ to $V_1$.

The voltage at the input to C3 is $$V_3 = \frac{P_1 V_i R_4 - V_c R_a}{R_4 + R_a}$$

The voltage at the output of C3 will go positive when $V_3 > 0$ or when $$V_i > V_c \frac{R_a}{P_1 R_4}.$$

At this point, $V_c$ charges in a positive direction until $V_3 < 0$ at which point the output of C3 goes negative, turning diode D1 off. Thus, the voltage on the capacitor $C_2$ rises as $V_i$ rises and remains at $$V_c = V_{ip} \frac{P_1 R_4}{R_a}$$

after $V_i$ decreases below its maximum, where $V_{ip}$ is the peak input voltage. This voltage $V_c$ decays with an exponential time constant through $V_i$, $R_a$, $R_b$, $R_4$ and $R_8$ which is quite slow compared to the charging time constant through the output of C3 and D1 (see $V_c$ waveform, FIG. 4). Thus, the next input pulse will charge the capacitor again to its peak voltage restoring any small voltage decay lost between pulses.

Referring back to FIG. 1, the voltage at the input to C2 is $$V_2 = \frac{V_1(R_3 + R_4) - V_c R_2}{R_2 + R_3 + R_4}$$

Comparator C2 triggers when $V_2$ becomes $$V_2 \geq 0 \text{ or } V_1 > V_c \frac{R_2}{R_3 + R_4}$$

In terms of the input voltage $$P_1 V_i \geq V_{ip} \frac{P_1 R_4}{R_2 + R_3} \cdot \frac{R_2}{R_3 + R_4} \text{ or}$$

$$V_i \geq V_{ip} \frac{R_2}{R_2 + R_3} \cdot \frac{R_4}{R_3 + R_4}$$

It is obvious that several variations of the aforedescribed circuit are possible. The trigger and arming comparators may be connected to produce rising edge transitions when triggering and arming; the peak detector may be connected to produce a negative peak voltage on $C_2$ or the diode D1 may be omitted if some other rectifying element is used instead. In addition, the differential-to-peak detector circuit (FIG. 3) may be used by itself whenever appropriate to produce a peak detected voltage proportional to a differential input signal. Further, the capacitor voltage $V_c$ could be buffered to $R_8$ by a unity-gain connected op-amp, thus allowing independent control of the exponential decay of voltage $V_c$ between pulses.

Figure 5:
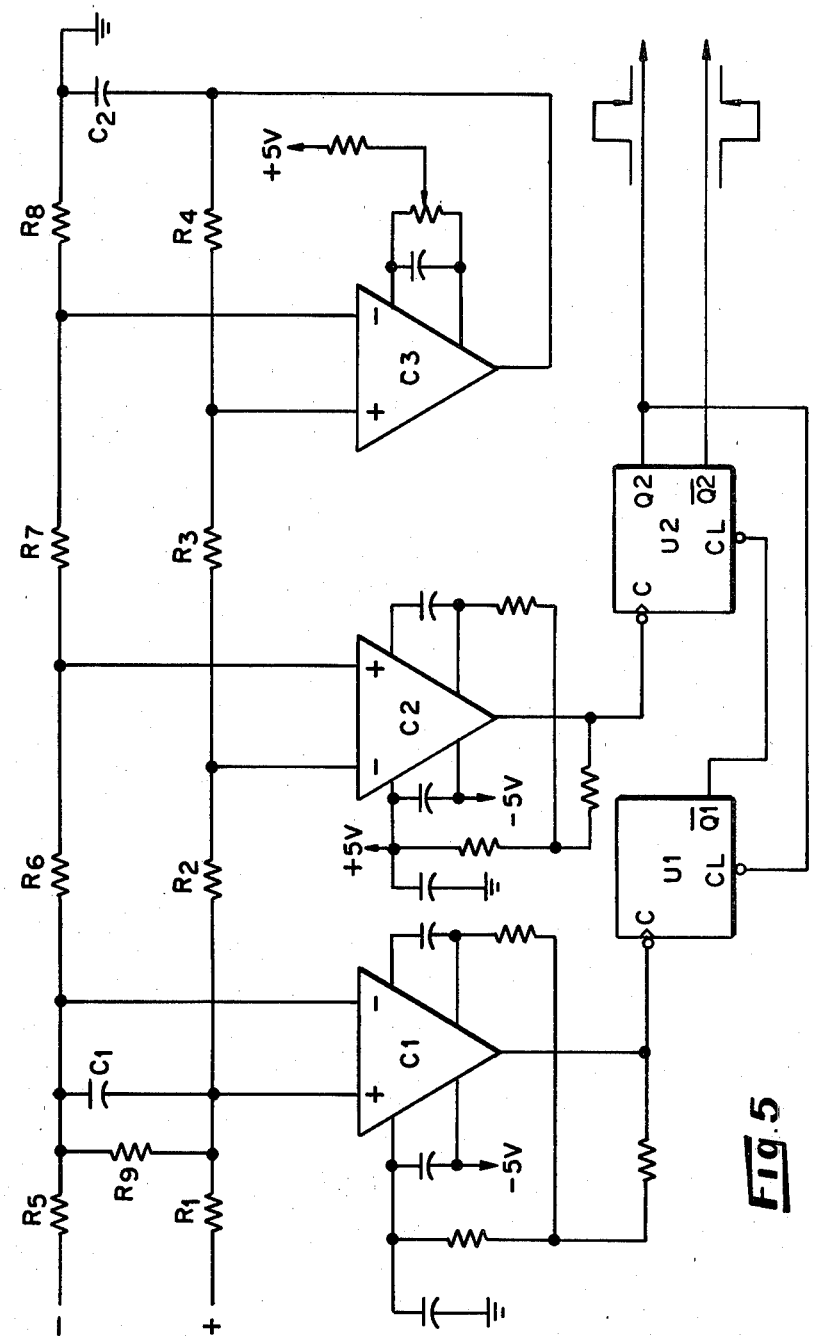
FIG. 5 is a schematic diagram of a digital timing circuit employing the pulse conditioner of FIG. 1.

FIG. 5 shows one embodiment of the subject low noise pulse conditioner circuit employed to drive a digital pulse-forming circuit for corresponding timing with the input pulse. The peak detector in this circuit develops a negative voltage across capacitor $C_2$ by utilizing the output rectifying transistor structure of an LM111 based comparator whereby the rectifying diode is eliminated. The LM111 operational amplifier is supplied by National Semiconductor, Santa Clara, Calif. Other equivalent devices may also be used. The comparators have hysteresis and noise-suppressing networks added to provide reliable well-defined low-amplitude arming and trigger thresholds.

A logic circuit composed of flip-flops U1 and U2 may be used which responds only to zero-crossing detected outputs from C1 for signals which first exceed the arming voltage level producing an arming signal output at C2.

The output of C1 is connected to the clock input of flip-flop U1 and the output of C2 is connected to the clock input of flip-flop U2. The Q output of flip-flop U2 is connected to the clear input of U1 and the $\overline{Q}$ output of U1 is connected to the clear input of U2. These flip-flops are falling edge triggered devices. The Q output of U2 is initially low, holding $\overline{Q}1$ high even though the output of C1 may fall due to false input pulses or noise between the desired signal input pulses. The flip-flop network will not respond until U2 receives a falling edge signal from the arming comparator C2. In response to this, Q2 goes high removing the clear signal from U1 and thus enabling the clock. At this point, the output of C1 is high since the input pulse level has exceeded the comparator C1 threshold. Since the flip-flops are falling edge clocked, or triggered, U2 does not change when the arming signal from C2 returns high. When the output of C1 goes low in response to the zero crossing of the input signal ($V_i$), $\overline{Q}1$ goes low forcing Q2 low, which clears U1 in turn, thus forcing $\overline{Q}1$ high again and disabling any further response to outputs from C1 until flip-flop U2 becomes armed again by another input pulse. With this arrangement both a rising edge and a falling edge digital signal at the zero crossing of the input signal are available from the U2 outputs. Hysteresis is provided for C1 and C2 for two purposes. Since the signals at the inputs to the comparators are extremely slow, microvolt level noise could cause multiple transitions or oscillations at the outputs to occur during movement of the input signal across the active region of the comparator inputs. The hysteresis prevents this very effectively. The second reason is that for the extremely low level signals present at centrifuge start-up, the comparator offsets could allow a race condition to develop at the flip-flop inputs. The amount of the hysteresis is designed so that the output of C1 is always high before arming can occur from C2. The hysteresis is applied in accordance with the model LM111 application notes so that its magnitude is essentially immune to power supply variations and its noise susceptibility is low. The variable offset adjustment on C3 is used to adjust the peak holding capacitor $C_2$ voltage to zero when the input voltage is zero. This guarantees that low signal threshold requirements are met and aids in achieving the race-free operation already mentioned.

Figure 6:
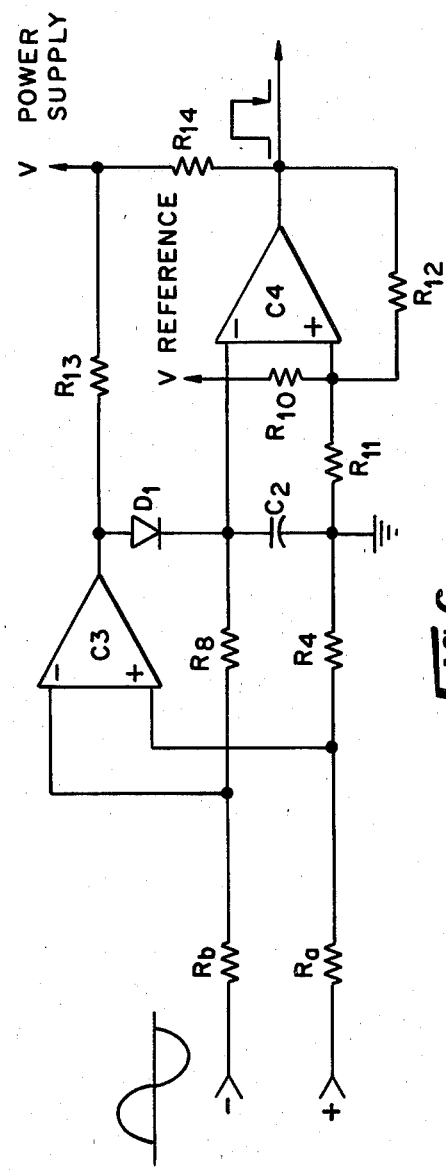
FIG. 6 is a schematic diagram of an independently operating differential-to-peak detector according to the present invention which may be used to drive a DC level sensing circuit.

Referring now to FIG. 6, there is shown an alternate embodiment of a low noise pulse conditioner for driving a digital processing circuit employing the differential-to-peak detector including the comparator C3, diode D1, resistors $R_4$ and $R_8$, resistors $R_a$ and $R_b$, and capacitor $C_2$, as shown in FIG. 3. In this circuit the output of the detector, the voltage $V_c$, is connected to a comparator C4. Comparator C4 has a voltage reference applied to its (+) input via the resistor voltage divider composed of $R_{10}$ and $R_{11}$. If the voltage across $C_2$ becomes larger than this voltage applied at the (+) input of C4, the output of comparator C4 goes low providing an alarm function signaling that the peak input voltage is greater than some fixed threshold. The opposite is the case also; C4 output is high in response to a $C_2$ voltage lower than some fixed threshold. Resistor $R_{12}$ provides hysteresis so that the two thresholds (lower and upper) can be separated. $R_{13}$ and $R_{14}$ are required by the use of LM139S or similar open collector output devices for the comparators. The input signal in this case is a continuous AC signal, not a pulse as is the case with a Fidler signal.

It will be appreciated that an improved low noise pulse conditioner has been provided based on a unique differential-to-peak detector which is used to bias the conditioner input circuit differentially. This circuit requires only one input ground reference for a differential signal input which reduces the introduction of noise into the circuit as opposed to multiple ground reference points which allow noise signals to be conducted into signal processing circuitry. Further, the direct differential input provides less opportunity for noise, or jitter, to be introduced through active circuits normally used in the input to convert from a differential signal to a ground referenced signal prior to processing.

The foregoing description of the invention has been presented for purposes of illustration and description and is not intended to be exhaustive or to limit the invention to the precise form disclosed. It is presented to best explain the principles of the invention and their practical application to thereby enable others skilled in the art to best utilize the invention in various embodiments and with various modifications as are suited to the particular use contemplated. It is intended that the scope of the invention be defined by the claims appended hereto.

What is claimed is:

1. A differential-to-peak detector, comprising:
   a comparator amplifier having an inverting input, a non-inverting input and an output;
   a signal attenuating input circuit means for attenuating said differential input signal and applying said attenuated input signal to said inverting input of said comparator;
   a storage capacitor connected at one end to ground potential;
   a first resistor connected between the grounded end of said capacitor and said non-inverting input of said amplifier;
   a second resistor connected between the other end of said capacitor and said inverting input of said amplifier; and
   a rectifying means for coupling the output voltage of said amplifier across said capacitor when the attenuated differential input signal voltage exceeds the voltage across said capacitor so that said capacitor remains charged to a selected voltage level proportional to the peak voltage of said differential signal.

2. The detector as set forth in claim 1 wherein said rectifying means includes a diode connected in series with the output of said amplifier.

3. A pulse conditioning circuit for converting differentially generated AC input pulses to digital pulses corresponding in time with the zero-crossing of each of said AC pulses, comprising:

a differential-to-peak detector means responsive to said AC input pulses for generating a reference signal in differential opposition to the initial polarity of said AC input pulses;

a first comparator amplifier for generating a digital signal transition at an output thereof when the amplitude of the AC input pulses applied thereto falls below a first threshold voltage level corresponding to said zero crossing of said input pulses;

a second comparator amplifier for generating an arming signal at an output thereof when the amplitude of said input pulses applied thereto exceeds a second threshold voltage level;

signal attenuating input circuit means for resistively interconnecting each of said first and second comparator amplifiers and said differential-to-peak detector means to provide said first and second threshold voltage levels to said first and second comparator amplifiers, respectively, derived from said reference signal generated by said differential-to-peak detector means; and a logic circuit means responsive to the outputs of said first and second comparator amplifiers for generating a digital signal transition at an output thereof corresponding to the zero-crossing of said input signals of sufficient amplitude to generate said arming signal.

4. The pulse conditioning circuit as set forth in claim 3 wherein said differential-to-peak detector includes a third comparator amplifier having an inverting input and a non-inverting input connected to receive said attenuated input signal therebetween through said input circuit means, a storage capacitor connected at one end to ground potential, a first resistor connected between the grounded end of said capacitor and said non-inverting input of said amplifier, a second resistor connected between the other end of said capacitor and said inverting input of said amplifier, and a rectifying means for coupling the output voltage of said third comparator amplifier across said capacitor when the attenuated differential signal input voltage exceeds the voltage across said capacitor so that said capacitor remains charged to a selected voltage level corresponding to said reference signal.

* * * * *